(12) United States Patent
Aoki et al.

(10) Patent No.: US 10,566,302 B2
(45) Date of Patent: *Feb. 18, 2020

(54) FABRICATION OF SOLDER BALLS WITH INJECTION MOLDED SOLDER

(71) Applicant: INTERNATIONAL BUSINESS MACHINES CORPORATION, Armonk, NY (US)

(72) Inventors: Toyohiro Aoki, Kawasaki (JP); Takashi Hisada, Kawasaki (JP); Eiji I. Nakamura, Kawasaki (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/987,029

(22) Filed: May 23, 2018

(65) Prior Publication Data
US 2018/0269173 A1 Sep. 20, 2018

Related U.S. Application Data

(63) Continuation of application No. 15/625,033, filed on Jun. 16, 2017, now Pat. No. 10,037,958, which is a
(Continued)

(51) Int. Cl.
*H01L 23/00* (2006.01)
(52) U.S. Cl.
CPC .............. *H01L 24/11* (2013.01); *H01L 24/02* (2013.01); *H01L 24/13* (2013.01); *H01L 24/94* (2013.01); *H01L 2224/024* (2013.01); *H01L 2224/0239* (2013.01); *H01L 2224/02313* (2013.01); *H01L 2224/11003* (2013.01); *H01L 2224/119* (2013.01); *H01L 2224/1111* (2013.01); *H01L 2224/11013* (2013.01); *H01L 2224/1148* (2013.01); *H01L 2224/11312* (2013.01); *H01L 2224/11849* (2013.01); *H01L 2224/13014* (2013.01); *H01L 2224/13018* (2013.01); *H01L 2224/13024* (2013.01); *H01L 2224/13111* (2013.01); *H01L 2224/13139* (2013.01);
(Continued)

(58) Field of Classification Search
CPC ....................................................... H01L 24/11
See application file for complete search history.

(56) References Cited

U.S. PATENT DOCUMENTS 9,275,878 B2 3/2016 Wachter et al.
10,037,958 B2 * 7/2018 Aoki ....................... H01L 24/02
(Continued)

OTHER PUBLICATIONS

List of IBM Patents or Patent Applications Treated as Related dated May 23, 2018, 2 pages.
(Continued)

*Primary Examiner* — William Coleman
(74) *Attorney, Agent, or Firm* — Tutunjian & Bitetto, P.C.; Vazken Alexanian

(57) ABSTRACT

Wafers include multiple bulk redistribution layers. A contact pad is formed on a surface of one of the bulk redistribution layers. A final redistribution layer is formed on the surface and in contact with the contact pad. Solder is formed on the contact pad. The solder includes a pedestal portion formed to a same height as the final redistribution layer and a ball portion above the pedestal portion.

20 Claims, 5 Drawing Sheets

Related U.S. Application Data continuation of application No. 15/297,269, filed on Oct. 19, 2016, now Pat. No. 9,837,367.

(52) U.S. Cl.
CPC ............... *H01L 2224/13147* (2013.01); *H01L 2924/066* (2013.01); *H01L 2924/0695* (2013.01); *H01L 2924/07025* (2013.01)

(56) References Cited

U.S. PATENT DOCUMENTS

| | | |
|---|---|---|
| 2011/0291215 A1 | 12/2011 | Tu et al. |
| 2013/0299975 A1 | 11/2013 | Pagaila et al. |
| 2014/0162407 A1 | 6/2014 | Zwenger et al. |
| 2015/0348920 A1 | 12/2015 | Yap et al. |
| 2016/0155680 A1 | 6/2016 | Stueckjuergen et al. |
| 2016/0190028 A1 | 6/2016 | Shi |

OTHER PUBLICATIONS

Jun Mukawa et al., Development of Liquid Photoresist for IMS (Injection Molder Solder) with High Thermal Stability, J. Photopolym. Sci. Technol., vol. 29, May 2016.

P.A. Gruber et al., Injection Molded Solder Technology for Pb-free Wafer Bumping, Electronic Components and Technology Conference, 2004. Proceedings. 54th, Jun. 2004, pp. 650-654.

Jae-Woong Nah et al., Injection Molded Solder—A New Fine Pitch Substrate Bumping Method, 2009 59th Electronic Components and Technology Conference, San Diego, CA, May 2009, pp. 61-66.

Toyohiro Aoki et al., Characterization of Micro Bump Formed by Injection Molded Solder (IMS) Technology, Electronics Packaging (ICEP), 2014 International Conference on, Toyama, Apr. 2014, pp. 544-548.

Jae-Woong Nah et al., Mask and mask-less injection molded solder (IMS) technology for fine pitch substrate bumping, International Symposium on Microelectronics: Nov. 2010, vol. 2010, No. 1, pp. 000348-000354.

Toyohiro Aoki et al., IMS (Injection Molded Solder) Technology with Liquid Photoresist for Ultra Fine Pitch Bumping, International Symposium on Microelectronics: Sep. 2014, vol. 2014, No. 1, pp. 000713-000717.

Eric D. Perfecto, C4NP Technology: Manufacturability, Yields and Reliability, 2008 58th Electronic Components and Technology Conference, Lake Buena Vista, FL, May 2008, pp. 1641-1647.

Jae-Woong Nah et al., Wafer IMS (Injection Molded Solder)—A New Fine Pitch Solder Bumping Technology on Wafers with Solder Alloy Composition Flexibility, 2014 IEEE 64th Electronic Components and Technology Conference (ECTC), Orlando, FL, Sep. 2014, pp. 1308-1313.

\* cited by examiner

FABRICATION OF SOLDER BALLS WITH INJECTION MOLDED SOLDER

BACKGROUND

Technical Field

The present invention generally relates to the formation of solder balls on a wafer and, more particularly, to the formation of such solder balls using injection molding.

Description of the Related Art

As fabrication processes reach density limits in the fabrication of two-dimensional (2D) integrated circuits, three dimensional (3D) and two-and-a-half dimensional (2.5D) packaging processes are gaining traction due to their ability to provide high bandwidth and short transmission lengths between devices. 2.5D packaging processes stack multiple layers of 2D circuits, each having their components arrayed in a single horizontal plane. An intermediary layer provides vertical interconnects between the vertically stacked device layers. True 3D packages, meanwhile, have one die stacked directly on top of another die, with through-silicon vias providing communications between components at different vertical levels.

In each case, dies are mounted to one another with electrical interconnections. This may be accomplished by forming solder bumps on the surface of one or more of the dies to be bonded prior to the bonding. One die is then positioned over the other (e.g., in a "flip-chip" process) and the solder is reflowed, creating the appropriate electrical connections.

However, the joining pitch and bump size need to be very fine for 3D and 2.5D packages compared to conventional flip-chip bonding. This results in a challenging fabrication process that sometimes results in join failures due to stress concentration at the joining area and at the joining interface, as well as electromigration failures due to high current densities.

One form of packaging is wafer-level packaging, which packages an integrated circuit while the chip is still part of the wafer. After the packages have been formed, they may be separated from one another by cutting the wafer. In such a process, the interconnections and solder bumps are formed for many chips all at once.

Existing processes for forming solder balls include screen printing, where a reusable metal mask is placed on a die before solder is printed on, and solder ball dropping, where pre-formed solder balls are physically positioned in the reusable mask. Another approach uses electroplating or electroless plating to form solder on an exposed seed metal over contact pads for the die. In the case of screen printing and solder ball drop processes, there is a risk of void creation as flux material becomes a gas during solder reflow. Pre-forming solder balls also adds significant additional expense and, furthermore, the solder balls are often incompletely distributed. Solder plating, meanwhile, can be too time consuming to be practical for large-scale fabrication.

SUMMARY

A wafer includes multiple bulk redistribution layers. A contact pad is formed on a surface of one of the bulk redistribution layers. A final redistribution layer is formed on the surface and in contact with the contact pad. Solder is formed on the contact pad. The solder includes a pedestal portion formed to a same height as the final redistribution layer and a ball portion above the pedestal portion.

A wafer includes multiple bulk redistribution layers. Multiple contact pads are formed on a surface of one of the bulk redistribution layers. A final redistribution layer is formed on the surface and in contact with the contact pads. The final redistribution layer has holes directly over the contact pads. Solder is formed on respective contact pads. The solder includes a pedestal portion formed to a same height as the final redistribution layer and a ball portion above the pedestal portion.

A wafer includes multiple bulk redistribution layers. A contact pad is formed on a surface of one of the bulk redistribution layers. A final redistribution layer is formed on the surface and in contact with the terminal contact pad. The final redistribution layer is formed from a phenolic resin. Solder is formed on the terminal contact pad.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention make use of injection molding to provide solder material to a wafer. To accomplish this, materials are used in wafer fabrication that are resistant to high pressure and temperature, so that those materials are able to withstand direct contact with the injection head. In one embodiment, the last dielectric layer of the die is made particularly thick to provide a mold for the injected solder at the contact pads of the die. In another embodiment, a mold resist is provided which is patterned along with the last dielectric layer of the die to expose the contact pads. In all of the present embodiments, an injection head is then provided in physical contact with the molds and solder is injected into each. The molds are then etched back and the injected solder is reflowed to form solder balls suitable for flip-chip bonding or package joining to the printed circuit board.

Figure 1:
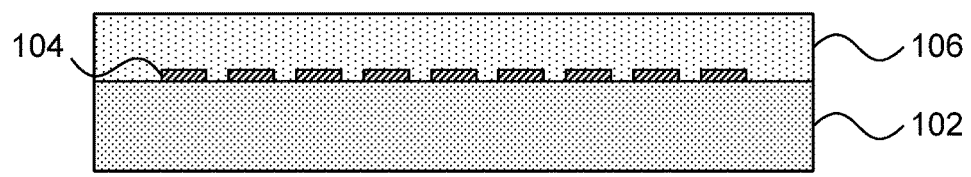
FIG. 1 is a cross-sectional diagram of a step in the formation of solder balls on a wafer in accordance with the present embodiments.

Referring now to FIG. 1, a cross-sectional view of a step in the formation of solder balls on a die is shown. A die is formed with redistribution layer (RDL) 102/106. The redistribution layer 102/106 includes multiple dielectric layers, each of which may include devices, conductive interconnects, vias, terminal pads, and other features. In the present embodiments the bulk of the die is abstractly shown as RDL bulk 102, which may itself include multiple different dielectric layers and components. A set of terminal contact pads 104 are formed on the RDL bulk 102, providing electrical access to the devices formed in and on the RDL bulk.

In general, the RDL bulk 102 is formed by coating dielectric material on a wafer that has a terminal pad opening, patterning interconnection vias and metal wiring in the dielectric pad using lithographic processes, plating conductive metal (e.g., copper, silver, gold, etc.), and repeating for each layer of the RDL bulk 102. Exemplary materials that may be used in the layers of the RDL bulk 102 include polymide, polybenzoxazoles, and benzocyclobutanes. After the appropriate number of wiring layers are fabricated, with contact pads 104 exposed, the last RDL 106 is formed and a pad opening is fabricated.

A final RDL 106 is formed over the terminal contact pads 104 and the RDL bulk 102. The final RDL 106 in this embodiment is formed with a thickness significantly greater than the final RDL of conventional processes. In the present embodiments, the final RDL 106 may be formed from, for example, a photosensitive phenolic resin or polymide material that can withstand high temperatures and pressures. Exemplary temperatures and pressures that the final RDL 106 will be subjected to range from, e.g., about 140° C. to about 300° C. and from about 0.01 MPa to about 0.2 MPa. While it is specifically contemplated that the final RDL 106 is formed from a material different from the material of the RDL bulk 102, the layers may be formed from the same material if the RDL bulk 102 is formed from a material that meets the temperature and pressure needs of the final RDL 106. The final RDL 106 may be spun on or deposited by any other appropriate deposition process, including, e.g., chemical vapor deposition (CVD), physical vapor deposition (PVD), atomic layer deposition (ALD), or gas cluster ion beam (GCIB) deposition.

Spin coating includes deposition of the last RDL material in liquid form. The die is then spun to evenly distribute the material, with an amount of RDL applied corresponding to a thickness of the final RDL 106. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

The thickness of the final RDL 106 is selected to be as thick as is needed to provide sufficient solder volume for a solder ball of an appropriate diameter. In one example, the thickness of the final RDL 106 may be approximately 50 µm to form solder balls having a diameter of approximately 90 µm.

Figure 2:
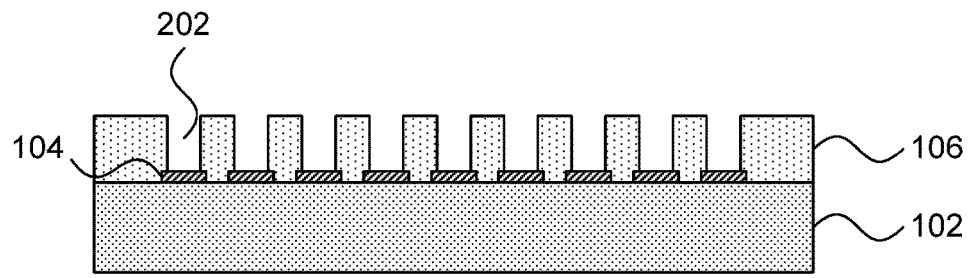
FIG. 2 is a cross-sectional diagram of a step in the formation of solder balls on a wafer in accordance with the present embodiments.

Referring now to FIG. 2, a cross-sectional view of a step in the formation of solder balls on a die is shown. The final RDL 106 is patterned and etched to expose the underlying terminal contact pads 104. Specifically, the pattern may be produced by masking the last RDL 106 and exposing the last RDL 106 to a pattern of radiation. The pattern may then be developed into the last RDL 106 utilizing a resist developer. Once the patterning of the last RDL 106 is completed, the sections covered by the mask are removed, while the exposed regions are protected using a selective etching process that removes the protected regions. It is specifically contemplated that a wet or dry chemical etch may be used to remove material from the last RDL 106, but any appropriate etching process, including anisotropic etching processes such as reactive ion etching (RIE), may be used instead. The etched RDL 106 includes holes 202 over the terminal contact pads 104. After etching, the final RDL 106 is baked to make the material non-strippable before solder injection.

RIE is a form of plasma etching in which during etching the surface to be etched is placed on a radio-frequency powered electrode. During RIE, the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
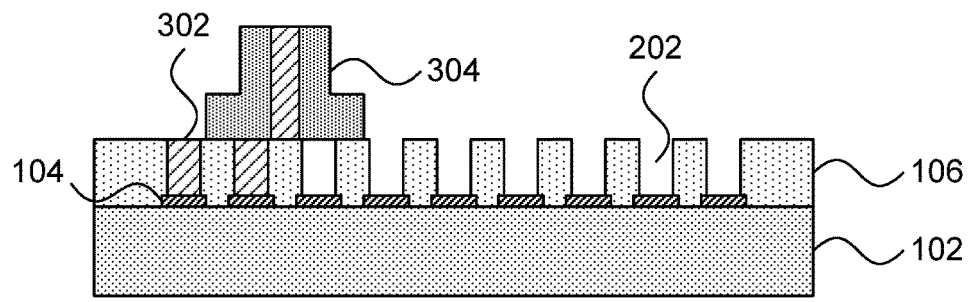
FIG. 3 is a cross-sectional diagram of a step in the formation of solder balls on a wafer in accordance with the present embodiments.

Referring now to FIG. 3, a cross-sectional view of a step in the formation of solder balls on a die is shown. An injection head 304 is moved in contact with the last RDL 106 and injects solder 302 into each of the holes 202. After one hole 202 has been filled, the injection head 304 moves in contact with the surface of the last RDL 106. The last RDL 106 has sufficient strength to remain intact without being damaged by the movement of the injection head 304, even at the high temperatures needed to keep the solder fluid for injection. It is specifically contemplated that the solder injection may be performed under vacuum, thereby preventing the creating of air gaps in the deposited solder.

In one specific embodiment, the solder may have a composition of about 0.5% copper, about 96.5% tin, and about 3% silver, but it should be understood that other solder compositions may be used with appropriate temperatures and pressures. In this specific example, a temperature of about 250° C. and an injection head pressure of about 0.02 MPa to about 0.15 MPa is used. Alternative solder compositions that are specifically contemplated include about 90% tin and about 10% antimony, with a melting temperature of about 266° C., and about 42% tin to about 58% bismuth, with a melting temperature of about 138° C. The above percentages are described in terms of weight percentage.

Figure 4:
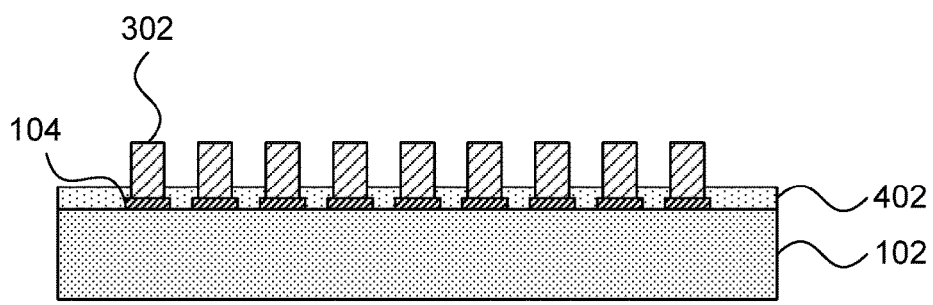
FIG. 4 is a cross-sectional diagram of a step in the formation of solder balls on a wafer in accordance with the present embodiments.

Referring now to FIG. 4, a cross-sectional view of a step in the formation of solder balls on a die is shown. The last RDL 106 is etched back. It is specifically contemplated that a plasma etch (using, e.g., an $O_2$, $CF_4$, $N_2$ or other plasma) may be used to remove material from the last RDL 106 to produce etched layer 402. The depth of the etch is selected to leave the solder fills 302 at an appropriate height above the etched layer 402.

Figure 5:
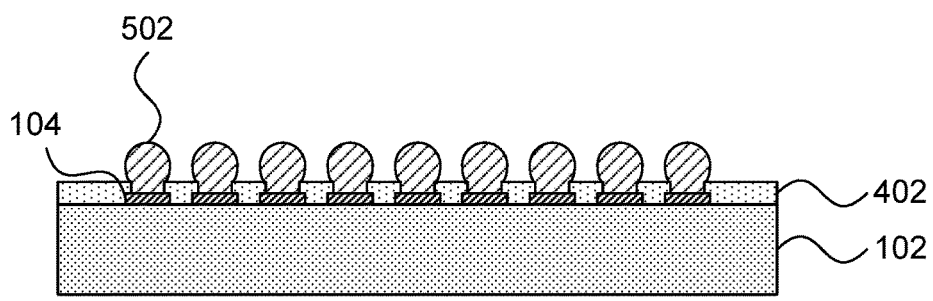
FIG. 5 is a cross-sectional diagram of a step in the formation of solder balls on a wafer in accordance with the present embodiments.

Referring now to FIG. 5, a cross-sectional view of a step in the formation of solder balls on a die is shown. After a flux material has been coated on the die, for example by spraying the flux material or by any other deposition process, a reflow process heats the die to a temperature above the melting point of the solder, causing the exposed solder posts 302 to melt. Under its own surface tension, the liquid solder material forms a spherical shape. These solder balls 502 are suitable for bonding to other wafers to form 2.5D or 3D chip packages. In the specific embodiment of using the tin-silver-copper solder composition, the reflow temperature may be about 260° C. In general, reflow peak temperature is about 35° C. to about 40° C. above the solder melting point.

Figure 6:
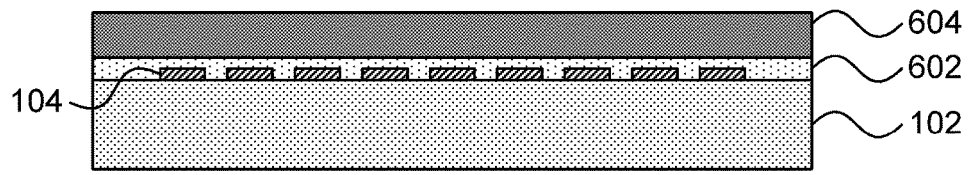
FIG. 6 is a cross-sectional diagram of an alternative step in the formation of solder balls on a wafer in accordance with the present embodiments.

Referring now to FIG. 6, a cross-sectional view of a step in an alternative embodiment of the formation of solder balls on a die is shown. In this embodiment, rather than using a thick final RDL 106, the final RDL 602 is relatively thin. An additional resist layer 604 is then deposited over the final RDL 602 using, e.g., a spin-on process. In this embodiment, the thin final RDL 602 is a standard RDL dielectric material, which need not have as a high tolerance for temperature and pressure as the resist layer 604. As noted above, the thickness of the resist layer 604, combined with the thickness of the thin final RDL 602 is determined according to a size of the solder ball to be produced. In this embodiment, the resist layer 604 may be formed from the same materials described above with respect to the thick final RDL 106, but without being completely baked in place.

Figure 7:
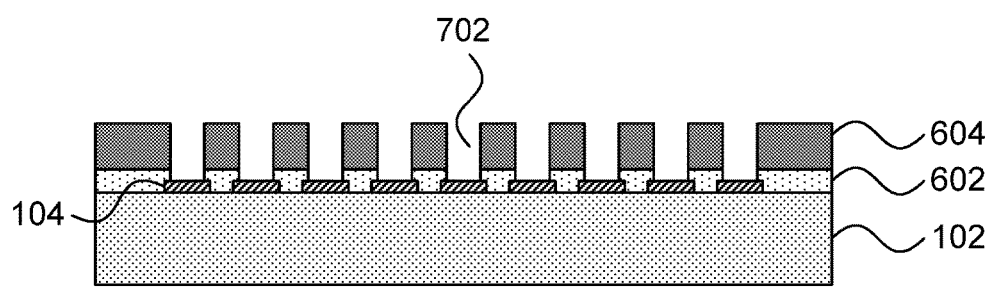
FIG. 7 is a cross-sectional diagram of an alternative step in the formation of solder balls on a wafer in accordance with the present embodiments.

Referring now to FIG. 7, a cross-sectional view of a step in an alternative embodiment of the formation of solder balls on a die is shown. As in the embodiment shown in FIG. 2, a mask is applied to pattern both the resist layer 604 and the thin final RDL 602, forming holes 702 that expose the terminal contact pads 104.

Figure 8:
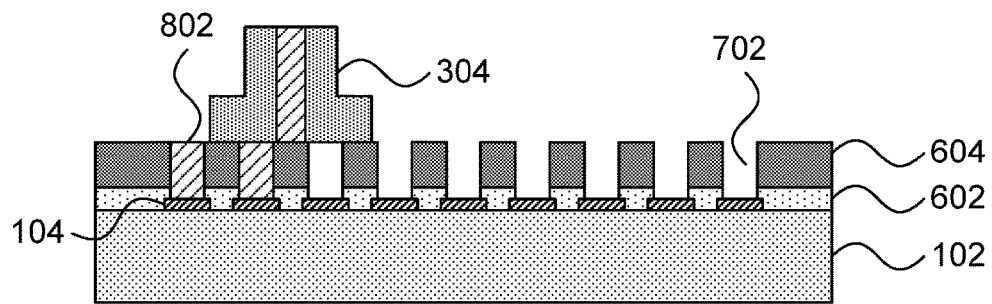
FIG. 8 is a cross-sectional diagram of an alternative step in the formation of solder balls on a wafer in accordance with the present embodiments.

Referring now to FIG. 8, a cross-sectional view of a step in an alternative embodiment of the formation of solder balls on a die is shown. The injection nozzle 304 is brought into contact with the etched resist layer 604 and injects solder 802 into the holes 702. As noted above, this process is performed under vacuum to prevent air holes from forming in the injected solder 802. The injection nozzle 304 is maneuvered in contact with the resist layer 604, and the material of the resist layer 604 is selected to withstand the pressure of the nozzle 304 and its high temperature. This process continues until all of the holes 702 are filled.

After the solder has been injected and solidifies, the resist layer 604 is removed. The resulting die resembles that of FIG. 4, before the reflow process. In this embodiment, the etch of the final RDL 602 to expose the terminal contact pads 104 is performed with a resist material that is suitable for the injection molding process, thereby saving a masking and etching step.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device use or operation in addition A the orientation depicted in the FIGS. For example, if the device in the FIGS. is turned over, elements described as "below" or "beneath" other elements or features would then be oriented "above" the other elements or features. Thus, the term "below" encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 9:
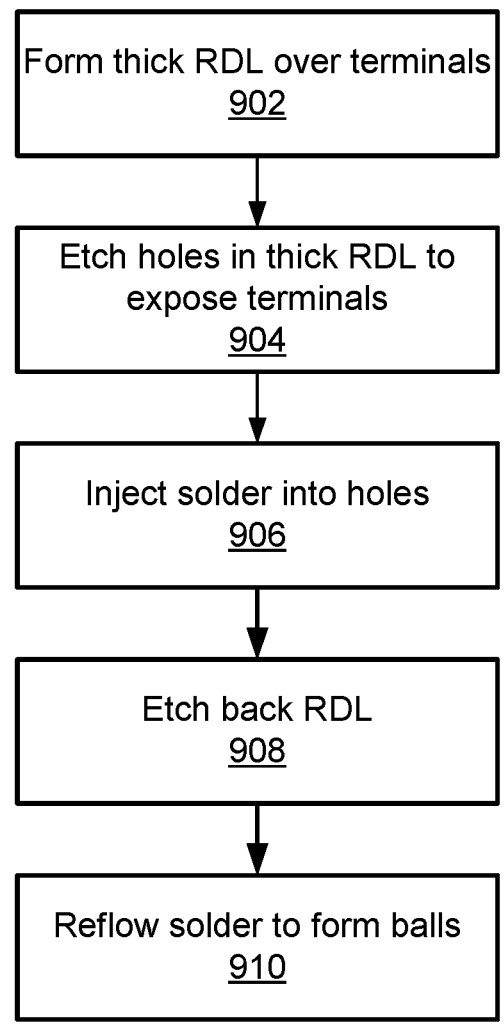
FIG. 9 is a block/flow diagram of a method of forming solder balls on a wafer in accordance with the present embodiments.

Referring now to FIG. 9, a method of forming solder balls is shown. Block 902 forms a thick final RDL 106 over the terminal contact pads 104. It is specifically contemplated that this may be performed by a spin-on process, though it should be understood that any appropriate deposition process may be used instead. Block 904 then etches holes 202 in the thick final RDL 106 to expose the terminal contact pads 104. Any appropriate process may be used to pattern the holes. It is specifically contemplated that photolithographic techniques may be used to pattern the material, followed by an appropriate wet or dry etch, but anisotropic etches such as a reactive ion etch (RIE) may be used instead.

Block 906 injects solder 302 into the holes 202. In one specifically contemplated embodiment, the solder 302 is injected directly into the holes 202 using an injection nozzle 304 that is in physical contact with the final RDL 106. Once the solder 302 has been injected, block 908 etches back the thick final RDL 106 to expose the sides of the solidified solder 302. Block 910 heats the solder 302 to cause the material to reflow. The solder material's own surface tension forms solder balls 502.

Figure 10:
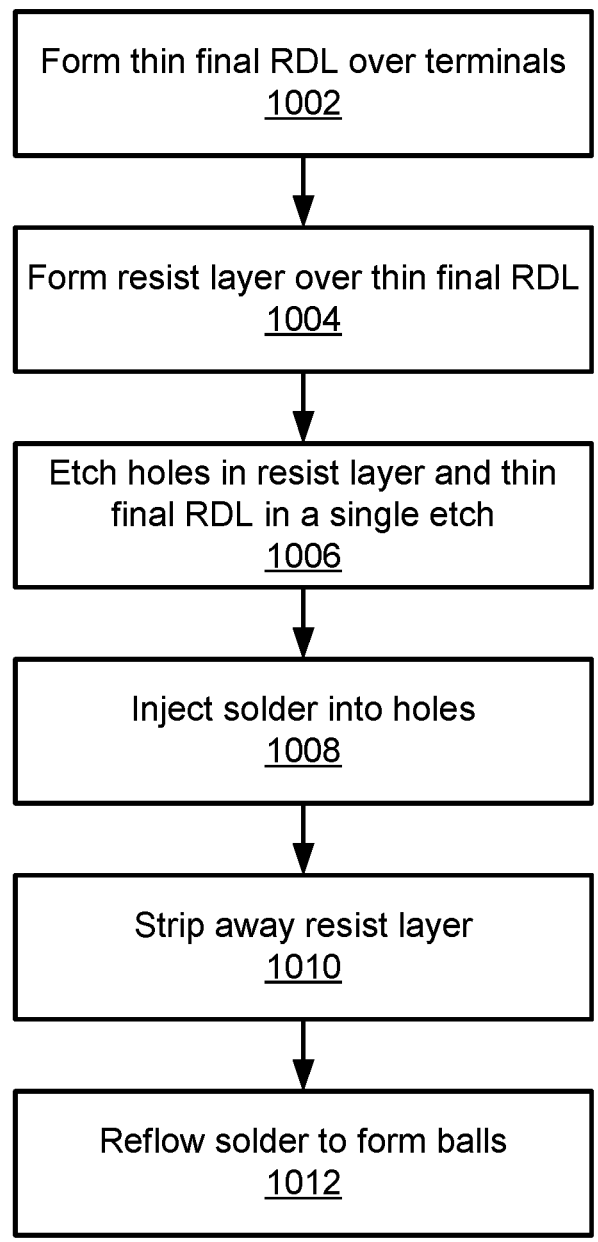
FIG. 10 is a block/flow diagram of a method of forming solder balls on a wafer in accordance with the present embodiments.

Referring now to FIG. 10, a method of forming solder balls is shown. Block 1002 forms a thin final RDL 602 over the terminal contact pads 104. As above, it is specifically contemplated that the thin final RDL 602 may be performed by a spin-on process, though any appropriate deposition process may be used instead. Block 1004 forms a resist layer 604 over the thin final RDL 602, again using a spin-on process or any other appropriate deposition process. Block 904 etches holes 702 into both the thin final RDL 602 and the resist layer 604 top expose the terminal contact pads 104. The etch in this case is performed using, e.g., a photolithographic mask and any appropriate etch.

Block 1008 injects solder 802 into the holes 702. As above, the solder 802 is injected directly into the holes 702 using an injection nozzle 304 that is in physical contact with the resist layer 604. Once the solder 802 has been injected, block 1010 strips away the resist layer 604 to expose the sides of the solidified solder 802. Block 1012 heats the solder 802 to cause the material to reflow. The solder material's own surface tension forms solder balls 502.

Having described preferred embodiments of the fabrication of solder balls with injection molded solder (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A wafer, comprising:
a plurality of bulk redistribution layers;
a contact pad on a surface of one of the bulk redistribution layers;
a final redistribution layer formed on the surface and in contact with the contact pad; and
solder formed on the contact pad, comprising a pedestal portion formed to a same height as the final redistribution layer and a ball portion above the pedestal portion.

2. The wafer of claim 1, wherein the final redistribution layer is formed from a material selected from the group consisting of a photosensitive phenolic resin and a polymide material.

3. The wafer of claim 1, wherein the wafer comprises a plurality of contact pads on the surface and solder formed on respective contact pads.

4. The wafer of claim 1, wherein the final redistribution layer comprises a hole formed directly over the contact pads.

5. The wafer of claim 1, wherein a top surface of the final redistribution layer has a height that is lower than a height of a top of the solder.

6. The wafer of claim 1, wherein a top surface of the final redistribution layer has a height that is greater than a height of a top surface of the contact pad.

7. The wafer of claim 1, wherein the plurality of bulk redistribution layers are formed from one or more of the materials selected from the group consisting of a polymide material, a polybenzoxazole material, and a benzocyclobutane material.

8. The wafer of claim 1, wherein the solder has a composition of about 0.5% copper, about 96.5% tin, and about 3% silver.

9. The wafer of claim 1, wherein the solder has a diameter of about 90 μm.

10. The wafer of claim 1, wherein the ball portion of the solder extends laterally above the final redistribution layer.

11. A wafer, comprising:
a plurality of bulk redistribution layers;
a plurality of contact pads on a surface of one of the bulk redistribution layers;
a final redistribution layer formed on the surface and in contact with the contact pads, the final redistribution layer having holes directly over the contact pads; and
solder formed on respective contact pads, comprising a pedestal portion formed to a same height as the final redistribution layer and a ball portion above the pedestal portion.

12. The wafer of claim 11, wherein the final redistribution layer is formed from a material selected from the group consisting of a photosensitive phenolic resin and a polymide material.

13. The wafer of claim 11, wherein a top surface of the final redistribution layer has a height that is lower than a height of a top of the solder.

14. The wafer of claim 11, wherein a top surface of the final redistribution layer has a height that is greater than a height of a top surface of the contact pad.

15. The wafer of claim 11, wherein the plurality of bulk redistribution layers are formed from one or more of the materials selected from the group consisting of a polymide material, a polybenzoxazole material, and a benzocyclobutane material.

16. The wafer of claim 11, wherein the solder has a composition of about 0.5% copper, about 96.5% tin, and about 3% silver.

17. The wafer of claim 11, wherein the solder has a diameter of about 90 μm.

18. The wafer of claim 11, wherein the ball portion of the solder extends laterally above the final redistribution layer.

19. A wafer, comprising:
a plurality of bulk redistribution layers;
a contact pad on a surface of one of the bulk redistribution layers;
a final redistribution layer formed on the surface and in contact with the terminal contact pad, wherein the final redistribution layer is formed from a phenolic resin; and
solder formed on the terminal contact pad.

20. The wafer of claim 19, wherein the phenolic resin is a photosensitive phenolic resin.

\* \* \* \* \*